United States Patent
Ishiguro

(10) Patent No.: US 7,602,248 B2
(45) Date of Patent: Oct. 13, 2009

(54) POWER AMPLIFIER AND ITS IDLING CURRENT SETTING CIRCUIT

(75) Inventor: Kazuhisa Ishiguro, Gunma (JP)

(73) Assignees: Niigata Seimitsu Co., Ltd., Jyoetsu-shi (JP); Ricoh Co., Ltd., Tokyo (JP)

( * ) Notice: Subject to any disclaimer, the term of this patent is extended or adjusted under 35 U.S.C. 154(b) by 0 days.

(21) Appl. No.: 12/092,523

(22) PCT Filed: Jul. 12, 2006

(86) PCT No.: PCT/JP2006/314206

§ 371 (c)(1),
(2), (4) Date: May 2, 2008

(87) PCT Pub. No.: WO2007/052389

PCT Pub. Date: May 10, 2007

(65) Prior Publication Data

US 2009/0115519 A1    May 7, 2009

(30) Foreign Application Priority Data

Nov. 4, 2005    (JP) .............................. 2005-320448

(51) Int. Cl.
*H03F 3/45*    (2006.01)

(52) U.S. Cl. ............... 330/255; 330/262; 330/257
(58) Field of Classification Search .............. 330/255, 330/262, 257, 267–268
See application file for complete search history.

(56) References Cited

U.S. PATENT DOCUMENTS

| | | | |
|---|---|---|---|
| 5,869,989 A * | 2/1999 | Furuya et al. | 327/112 |
| 5,889,433 A * | 3/1999 | Honma | 330/273 |
| 6,208,208 B1 * | 3/2001 | Komatsu et al. | 330/255 |

* cited by examiner

*Primary Examiner*—Robert Pascal
*Assistant Examiner*—Hieu P Nguyen
(74) *Attorney, Agent, or Firm*—Connolly Bove Lodge & Hutz LLP

(57) ABSTRACT

An idling current setting circuit (3) includes: current setting transistors (Q3, Q4) connected to output transistors (Q1, Q2) in a driver (2) in current mirror form; a plurality of current setting resistors (R1 to R4); and a plurality of switches (ASW1 to ASW4) for switching to any of the current setting resistors (R1 to R4). This enables the idling current to be set by the current mirror ratio between the current setting transistors (Q3, Q4) having no connection with the open gain of the power amplifier and the output transistors (Q1, Q2), so that the idling current can be arbitrarily set independently of the open gain.

3 Claims, 5 Drawing Sheets

Fig. 6

$$Id3 = Id4 = \frac{VDD - Vgs3 - Vgs4}{R1 + R2} \quad \cdots \text{(Formula 1)}$$

Fig. 7

$$Id3 = Id4 = \frac{VDD - Vgs3 - Vgs4}{R3 + R4} \quad \cdots \text{(Formula 2)}$$

Fig. 8

$$Id = \frac{1}{2} K' \frac{W}{L} (Vgs - Vth)^2 (1 + \lambda Vds) \quad \cdots \text{(Formula 3)}$$

$$K' = \mu_o C_{ox}$$

US 7,602,248 B2

POWER AMPLIFIER AND ITS IDLING CURRENT SETTING CIRCUIT

This application is a national phase of PCT/JP2006/314206, filed on Jul. 12, 2006, which claims priority to JP 2005-320488, filed Nov. 4, 2005, the entire contents of all are hereby incorporated by reference.

TECHNICAL FIELD

The present invention relates to a power amplifier and its idling current setting circuit, and more particularly to one suitable for use in a power amplifier of a type in which the output of a pre-driver is received by a rear-stage driver.

BACKGROUND ART

Power amplifiers are divided into class A, class AB, class B, class C, Class D and so on, by the difference of operating point. In class B amplifiers, bias current is zero when there is no signal (when no signal is inputted), and thus discontinuity occurs at a zero-cross point of alternating signal outputted when there is a signal (when a signal is inputted), causing crossover distortion. Accordingly, when no signal is inputted, a proper bias current is made to flow to reduce this distortion. Such current flowing when no signal is inputted is called an idling current; an amplifier of this type is called a class AB amplifier. Consequently, the operating point of class AB amplifier is the point where the load line slightly rises.

In class AB amplifiers, in order to implement low current consumption, there is usually used a "class AB push-pull type" in which the upper half portion (positive half period) of an alternating signal and the lower half portion (negative half period) are operated by separate transistors. In the class AB push-pull type, the upper half portion and lower half portion are driven by a rear-stage output transistor (driver) connected to a preceding-stage differential amplifier circuit (pre-driver) in push-pull form, whereby an output signal is produced (for example, refer to Patent Document 1).

Patent Document 1: Japanese Patent Application Laid-Open No. 11-308057

DISCLOSURE OF THE INVENTION

In prior art power amplifiers of this type, the idling current is held constant, irrespective of power output level. However, in a transmitter system in which multiple power output levels can be selected, when the idling current is held constant, the following problem arises. That is, when the idling current is set to a large value according to a maximum power output level of selectable multiple power output levels, the idling current becomes excessively large when a low power output level is selected, increasing wasted current consumption. On the contrary, when the idling current is set small to implement lower current consumption, a high power output level cannot be provided.

Thus, it is desirable that the idling current can be changed according to power output level. According to the invention described in the above Patent Document 1, an idling current setting circuit is provided so that the idling current can be changed. However, when the technique described in Patent Document 1 is used, the following problem arises.

Firstly, according to Patent Document 1, the idling current and open gain of the power amplifier cannot be set independently. More specifically, according to Patent Document 1, the idling current is determined by the current mirror ratio between transistors 103 and 203 and output transistors 104 and 204, and the values of resistors R3 and R4. Here, since the transistors 103 and 203 and the resistors R3 and R4 have connection with the open gain of the power amplifier, the idling current cannot be set arbitrarily independently of the open gain. Thus, it is difficult to optimally design the idling current and open gain according to the power output level.

Secondly, according to Patent Document 1, while the idling current of the driver can be changed, the current consumption of the pre-driver cannot be reduced. More specifically, according to the technique described in Patent Document 1, two signals outputted from the pre-driver (differential amplifier circuit 1) are separately supplied to the upper-stage and lower-stage drivers (output transistors 104 and 204), whereby the drivers connected to the pre-driver in push-pull form are driven. In this case, the pre-driver must have two outputs and thus two circuits for the two outputs are needed, so the current consumption of the pre-driver increases accordingly.

Thirdly, according to Patent Document 1, frequency characteristics may deteriorate in the high frequency range. As described above, according to Patent Document 1, signals are separately sent from the two outputs of the pre-driver to the drivers. And the two output signals are different by 180 degrees in phase from each other. However, there is a difference in circuit configuration between the signal path from the pre-driver for driving the output transistor 104 and the signal path from the pre-driver for driving the output transistor 204. Accordingly, when the frequency of amplified signal is high, the phase relationship between the two signals outputted from the pre-driver deviates from 180 degrees; this phase deviation causes distortions. Consequently, the amplifier described in Patent Document 1 cannot be used in the high frequency range.

The present invention has been made to solve the problems and has an object of providing a power amplifier which can be used even in the high frequency range and in which the idling current and open gain can be set independently and in which current consumption can be reduced in a transmitter system capable of performing selection among multiple power output levels.

In order to solve the problems, according to the present invention, in a power amplifier including a pre-driver, driver and idling current setting circuit; the pre-driver includes a differential pair constituted of two transistors and a current mirror circuit for receiving an output of the pre-driver as a single output in double end configuration; the driver includes a push-pull output transistor connected via the single output point of the pre-driver; the idling current setting circuit includes a current setting transistor connected to the output transistor of the driver in current mirror form, multiple current setting resistors, a switch for switching to any of the multiple current setting resistors, and a resistor of a high resistance value connected to a gate of the output transistor.

According to the present invention having the above configuration, the value of the resistor connected to the gate of the output transistor is significantly large, compared to the output impedance of the pre-driver. Thus, the attenuation of signal by the resistor of a high resistance value does not need to be considered. Accordingly, the current setting transistor has no connection with the open gain of the power amplifier. As a result, according to the present invention, the idling current can be set by the current mirror ratio between the current setting transistor having no connection with the open gain and the output transistor of the driver, so that the idling current can be arbitrarily set independently of the open gain. Consequently, it is possible to optimally design the idling current and open gain according to the power output level.

Also, according to the present invention, a single signal is outputted from the pre-driver and supplied to the push-pull output transistor constituting the driver, so two or more signal output circuits does not need to be provided in the pre-driver. Accordingly, the number of circuits which consume current can be reduced, thus allowing reduction of the current consumption of the pre-driver.

Also, according to the present invention, a single output signal of the pre-driver is sent from the pre-driver to the driver, so there is no inconvenience in that the phase relationship between the two output signals deviates in the high frequency range as with the prior art. Accordingly, it is possible to suppress the occurrence of distortions caused by a phase deviation in the high frequency range.

BRIEF DESCRIPTION OF THE DRAWINGS

FIG. 6 is a view illustrating the drain current of a current setting transistor;

FIG. 7 is a view illustrating the drain current of the current setting transistor; and FIG. 8 is a view illustrating the drain current of transistor when the channel modulation effect is considered.

BEST MODE FOR CARRYING OUT THE INVENTION

First Embodiment

Figure 1:
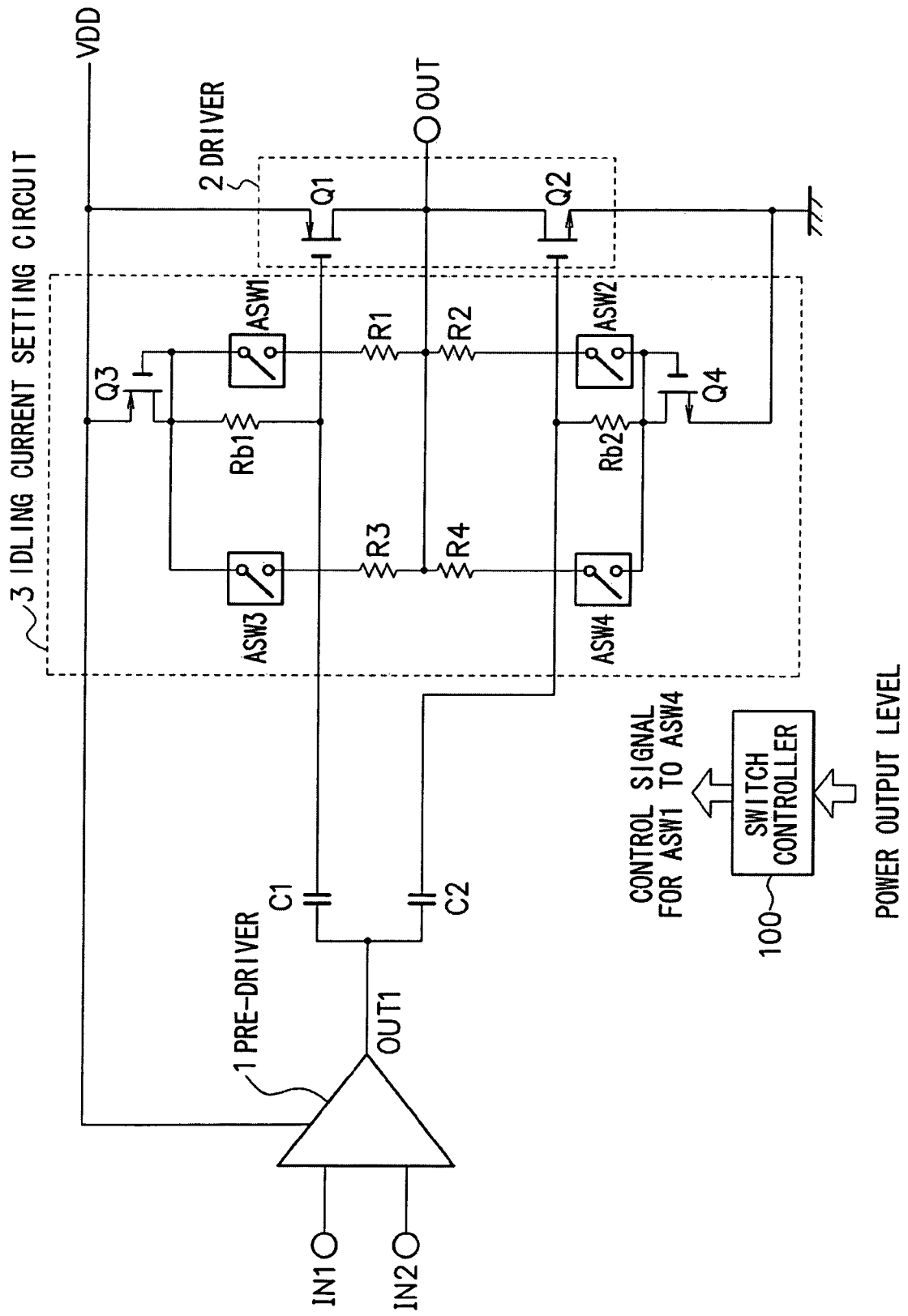
FIG. 1 is a view illustrating an exemplary configuration of power amplifier according to a first embodiment.

A first embodiment of the present invention will be described below with reference to the drawings. FIG. 1 is a view illustrating an exemplary configuration of power amplifier according to a first embodiment. As illustrated in FIG. 1, a power amplifier according to the present embodiment includes: a pre-driver 1 which amplifies the voltage of an input signal to a desired level; a driver 2 which amplifies the power of an output signal from the pre-driver 1 to a desired level; and an idling current setting circuit 3 which sets the idling current of the driver 2.

Figure 2:
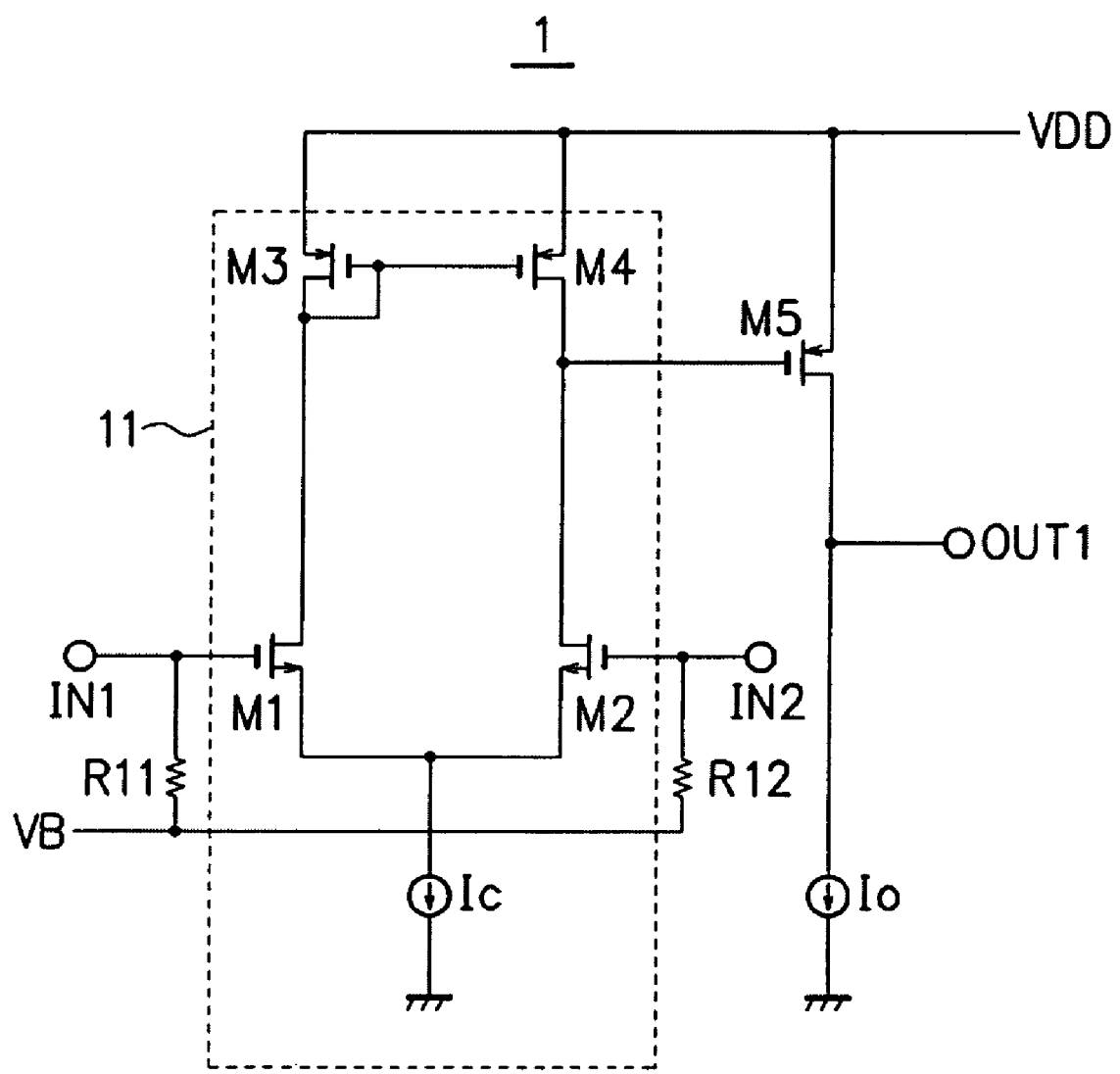
FIG. 2 is a view illustrating an exemplary configuration of pre-driver according to the first embodiment and a second embodiment.

FIG. 2 is a view illustrating an exemplary configuration of the pre-driver 1. Referring to FIG. 2, reference numeral 11 denotes a differential amplifier circuit, and the differential amplifier circuit 11 includes: a differential pair constituted of two transistors M1 and M2; current mirror circuits M3 and M4 for receiving an output of the differential amplifier circuit 11 as a single output in double end configuration; and a constant current circuit Ic connected to the differential pair. The gates of the pair of transistors M1 and M2 constituting the differential pair are connected to two input terminals IN1 and IN2.

The sources of the two transistors M1 and M2 are connected to a common source; and one end of the constant current circuit Ic is connected to this common source. The other end of the constant current circuit Ic is connected to the ground. The drains of the two transistors M1 and M2 are connected via the transistors M3 and M4, respectively, to a power supply VDD. The transistors M3 and M4 are connected to each other in current mirror form.

Resistors R11 and R12 are bias resistors for supplying a bias voltage VB to the transistors M1 and M2. A transistor M5 is a source-grounded transistor, and an output signal of the differential amplifier circuit 11 is supplied to the gate of the transistor M5; the transistor M5 functions as a source-grounded amplifier. The drain of the source-grounded amplifier M5 is connected to a constant current circuit Io and also to an output terminal OUT1. The source of the source-grounded amplifier M5 is connected to the power supply VDD. In this way, in the pre-driver 1 according to the present embodiment, the output of the differential amplifier circuit 11 is receiving via the source-grounded amplifier M5 as a single output.

The driver 2 includes push-pull output transistors Q1 and Q2 connected to the single output point OUT1 of the pre-driver 1. Here, the first output transistor Q1 is connected between the power supply VDD and the output terminal OUT of the power amplifier; and the second output transistor Q2 is connected between the output terminal OUT and the ground.

The two output transistors Q1 and Q2 of the driver 2 are connected via a capacitive coupling by capacitors C1 and C2 from single output point OUT1 of the pre-driver 1. More specifically, the two capacitors C1 and C2 are connected in parallel to the single output point OUT1 of the pre-driver 1, and the gates of the output transistors Q1 and Q2 are connected to the capacitors C1 and C2, respectively.

The idling current setting circuit 3 includes: current setting transistors Q3 and Q4 connected to the output transistors Q1 and Q2 of the driver 2 in current mirror form; multiple current setting resistors R1 to R4; multiple analog switches ASW1 to ASW4 for switching to any of the multiple current setting resistors R1 to R4; and resistors Rb1 and Rb2 of a high resistance value connected between the gates of the output transistors Q1 and Q2 and the gates of the current setting transistors Q3 and Q4.

More specifically in the first current setting transistor Q3, its drain and gate are connected. Also, its source is connected to the power supply VDD and the drain is connected via the first resistor Rb1 to the gate of the first output transistor Q1. In the second current setting transistor Q4, its drain and gate are connected. Also, its source is connected to the ground and the drain is connected via the second resistor Rb2 to the gate of the second output transistor Q2.

The gate of the first current setting transistor Q3 and the gate of the second current setting transistor Q4 are connected to each other via a series circuit constituted of the first analog switch ASW1, the first and second current setting transistors R1 and R2, and the second analog switch ASW2. Also, the gate of the first current setting transistor Q3 and the gate of the second current setting transistor Q4 are connected to each other via a series circuit constituted of the third analog switch ASW3, the third and fourth current setting transistors R3 and R4, and the fourth analog switch ASW4.

That is, between the gate of the first current setting transistor Q3 and the gate of the second current setting transistor Q4, there are connected in parallel the first series circuit constituted of the first analog switch ASW1, the first and second current setting resistors R1 and R2 and the second analog switch ASW2, and the second series circuit constituted of the third analog switch ASW3, the third and fourth current setting transistors R3 and R4, and the fourth analog switch ASW4.

Also, the first resistor Rb1 is connected between the gate of the first output transistor Q1 and the gate of the first current setting transistor Q3; and the second resistor Rb2 is connected between the gate of the second output transistor Q2 and the gate of the second current setting transistor Q4. The output terminal OUT of the power amplifier is connected as described above between the two output transistors Q1 and Q2 and also between the first and second current setting resistors R1 and R2 and also between the third and fourth current setting resistors R3 and R4.

The power amplifier of the present embodiment having the above configuration is used in a transmitter system capable of performing selection among multiple power output levels. In this case, the transmitter system includes a switch controller 100 which determines according to a selected power output level, which of the analog switches ASW1 to ASW4 to turn on, and outputs a resultant control signal. The idling current setting circuit 3 performs based on the control signal outputted from the switch controller 100, selection among the analog switches ASW1 to ASW4, so that an optimal idling current is set for the selected power output level.

In the present embodiment, there is described an example in which selection can be performed among two power output levels. For example, when the first power output level is selected, the first and second analog switches ASW1 and ASW2 turn on, and the third and fourth analog switches ASW3 to ASW4 turn off. In this case, the idling current of the driver 2 is determined by the current setting transistors Q3 and Q4 and current setting resistors R1 and R2.

More specifically, drain currents Id3 and Id4 of the current setting transistors Q3 and Q4 are expressed as (formula 1) of FIG. 6. In this case, it is assumed that the on-resistance of the analog switches ASW1 to ASW4 is significantly smaller than the resistance value of the current setting resistors R1 and R2. In this (formula 1), Vgs3 denotes a gate-source voltage of the current setting transistor Q3; and Vgs4 denotes a gate-source voltage of the current setting transistor Q4. An idling current determined by an aspect ratio between the current setting transistor Q3 and the current setting transistor Q4 flows in the output transistors Q1 and Q2 of the driver 2. Accordingly, the idling current of the driver 2 when the first power output level is selected depends on the gate-source voltages Vgs3 and Vgs4 of the current setting transistors Q3 and Q4 and the values of the current setting resistors R1 and R2.

Meanwhile, when the second power output level is selected, the first and second analog switches ASW1 and ASW2 turn off; and the third and fourth analog switches ASW3 and ASW4 turn on. In this case, the idling current of the driver 2 is determined by the current setting transistors Q3 and Q4 and the current setting resistors R3 and R4. More specifically, the drain currents Id3 and Id4 of the current setting transistors Q3 and Q4 are expressed as (formula 2) of FIG. 7. An idling current determined by an aspect ratio between the current setting transistor Q3 and the current setting transistor Q4 flows in the output transistors Q1 and Q2. Accordingly, the idling current of the driver 2 when the second power output level is selected depends on the gate-source voltages Vgs3 and Vgs4 of the current setting transistors Q3 and Q4 and the values of the current setting resistors R3 and R4.

As described above in detail, according to the first embodiment, there is provided the idling current setting circuit 3 including the multiple current setting transistors Q3 and Q4, multiple current setting resistors R1 to R4 and analog switches ASW1 to ASW4 which switches according to the selected power output level, so that the idling current of the driver 2 can be varied according to the power output level. More specifically, when a large power output is selected, the idling current of the driver 2 is set large accordingly; when a small power output is selected, the idling current of the driver 2 is set small, so that wasted current consumption can be reduced.

Further, the resistance values of the high resistance resistors Rb1 and Rb2 are significantly larger than the output impedance of the pre-driver 1, and thus the signal attenuation caused by the high resistance resistors Rb1 and Rb2 does not need to be considered. Accordingly, the current setting transistors Q3 and Q4 have no connection with the open gain of the power amplifier. As a result, according to the present embodiment, the idling current can be set by the current mirror ratio between the current setting transistors Q3 and Q4 having no connection with the open gain and the output transistors Q1 and Q2 of the driver 2, so the idling current can be arbitrarily set independently of the open gain of the power amplifier. Consequently, the idling current and the open gain can be optimally designed according to the power output level.

Further, according to the first embodiment, the pre-driver 1 includes, as illustrated in FIG. 2, the differential pair constituted of the two transistors M1 and M2, and the current mirror circuit M3, M4 for receiving the output of the pre-driver 1 as a single output in double end configuration. Thus, a single signal is outputted from the pre-driver 1, and this is supplied to the push-pull output transistors Q1 and Q2 constituting the driver 2. Accordingly, it is not needed to provide two signal output circuits in the pre-driver 1; thus, in addition to the fact that when the selected power output level is low, the current consumption of the driver 2 is reduced by decreasing the idling current of the driver 2, the current consumption of the pre-driver 1 can also be reduced. Further, according to the present embodiment, the pre-driver 1 and the driver 2 are capacitive-coupled by the capacitors C1 and C2, and thus an interface circuit can be omitted between the pre-driver 1 and driver 2, so that the current consumption in the interface circuit can be reduced.

Also, according to the first embodiment, a single output signal of the pre-driver 1 is sent from the pre-driver 1 to the driver 2, so the input signals to the push-pull output transistors Q1 and Q2 have the identical phase, and this eliminates the inconvenience that the phase relationship between the two output signals deviates in the high frequency range as with the prior art. Accordingly, the occurrence of distortions by a phase deviation in the high frequency range can be suppressed. Thus, the power amplifier according to the present embodiment can be used in a high frequency circuit as well as in a low frequency circuit.

Further, according to the first embodiment, the analog switches ASW1 to ASW4 for performing selection for idling current are not arranged on the signal path, and thus the capacitance components of the analog switches ASW1 to ASW4 don't affect the frequency characteristics. Therefore, the power amplifier according to the present embodiment is particularly useful for a high frequency circuit.

Second Embodiment

Figure 3:
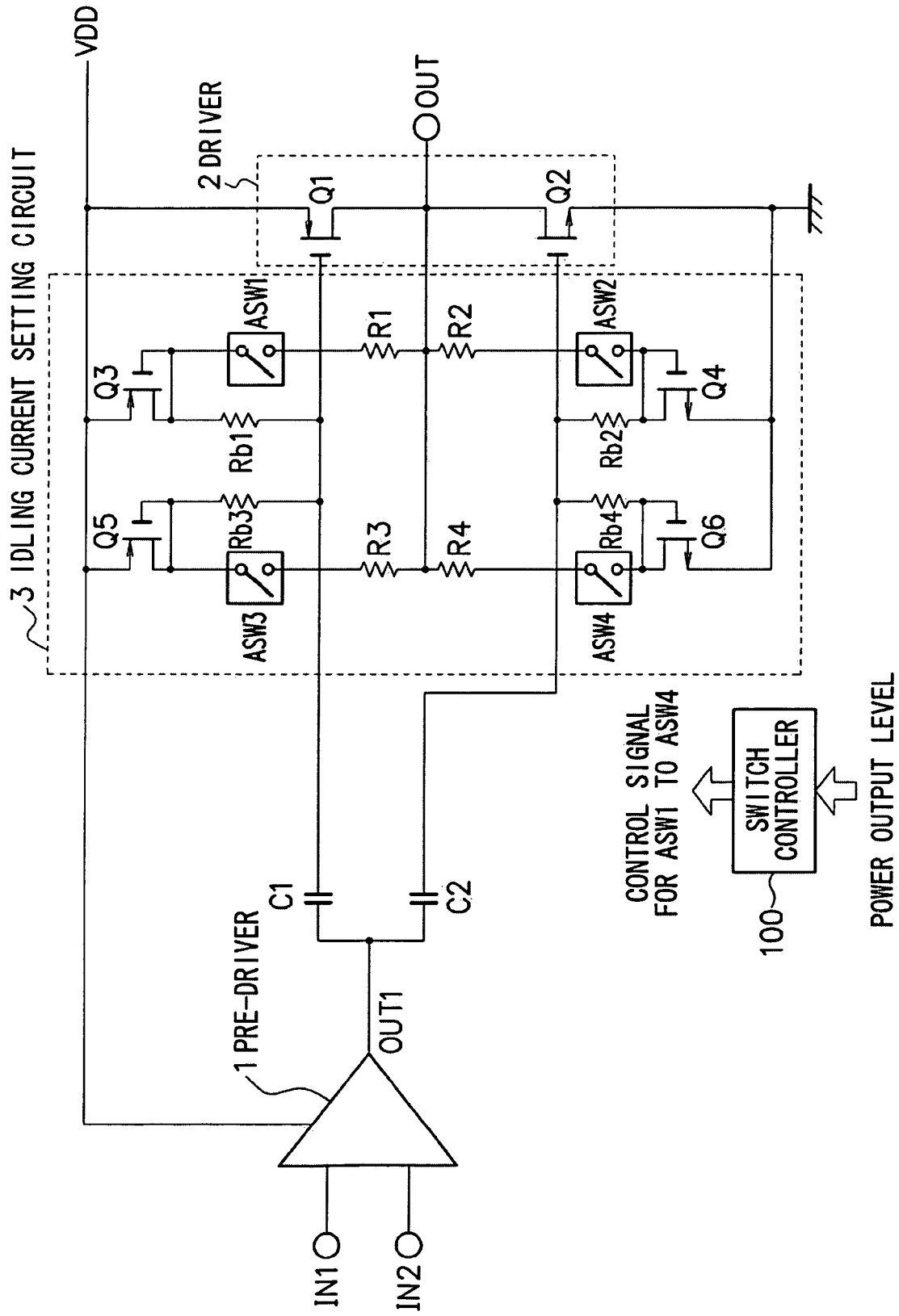
FIG. 3 is a view illustrating an exemplary configuration of power amplifier according to the second embodiment.

A second embodiment of the present invention will be described with reference to the drawings. FIG. 3 is a view illustrating an exemplary configuration of power amplifier according to the second embodiment. In FIG. 3, the components represented by the same reference numerals have the same functions as those shown in FIG. 1, and hence repeated explanation thereof is omitted here.

Assume that when selection among two power output levels can be performed in a transmitter system, first power output level >> second power output level. That is, assume that the first power output level is significantly larger than the second power output level. In this case, in optimizing the idling current when the second power output level is selected, the resistance values of the current setting resistors R1 and R2 must be set significantly large.

In such a case, as illustrated in FIG. 3, third and fourth current setting transistors Q5 and Q6 may be further provided and third and fourth high resistance resistors Rb3 and Rb4 may be further provided.

More specifically, in the third current setting transistor Q5, its drain and gate are connected. Also, its source is connected to the power supply VDD and the drain is connected via the third high resistance resistors Rb3 to the gate of the first output transistor Q1. In the fourth current setting transistor Q6, its drain and gate are connected. Also, its source is connected to the ground and the drain is connected via the fourth high resistance resistors Rb4 to the gate of the second output transistor Q2.

The gate of the first current setting transistor Q3 and the gate of the second current setting transistor Q4 are connected to each other via a series circuit constituted of the first analog switch ASW1, first and second current setting resistors R1 and R2 and second analog switch ASW2. Also, the gate of the third current setting transistor Q5 and the gate of the fourth current setting transistor Q6 are connected to each other via a series circuit constituted of the third analog switch ASW3, third and fourth current setting resistors R3 and R4 and fourth analog switch ASW4.

In a power amplifier according to the second embodiment having the above configuration, when the aspect ratio between the current setting transistors Q5 and Q6 and the output transistors Q1 and Q2 is properly set, optimization can be made without setting significantly large the resistance values of the current setting resistors R1 and R2.

Third Embodiment

Figure 4:
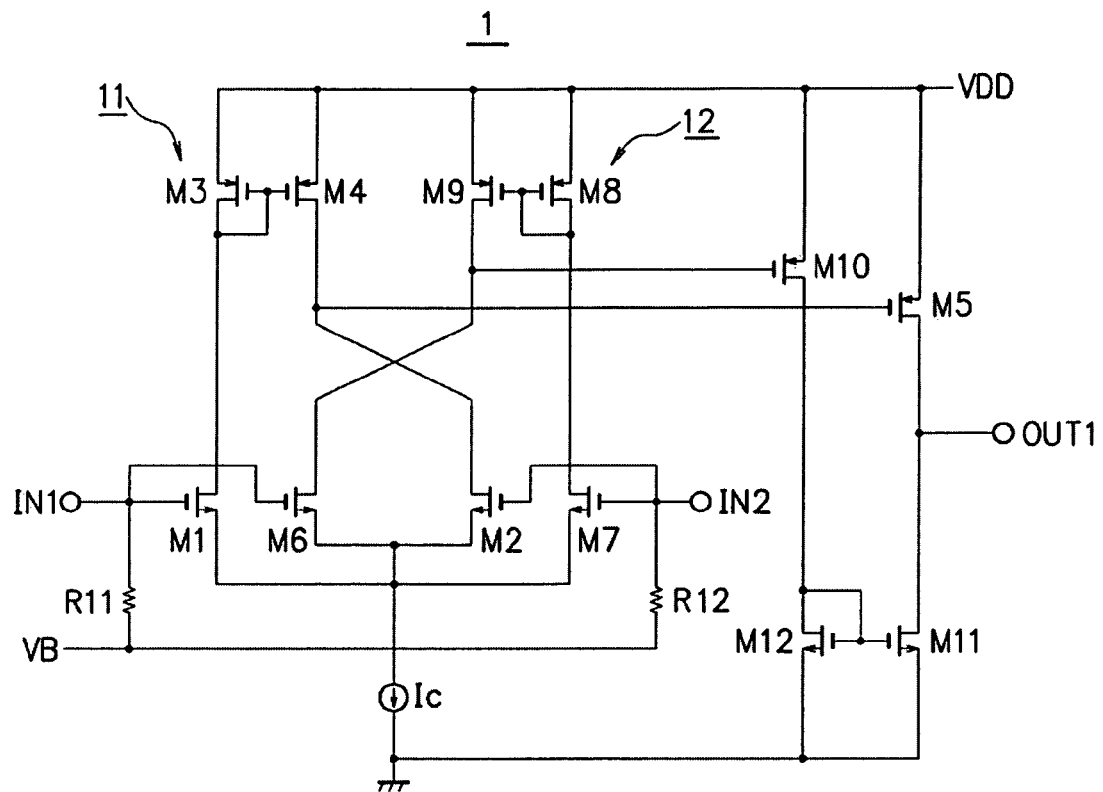
FIG. 4 is a view illustrating an exemplary configuration of pre-driver according to a third embodiment.

A third embodiment will be described with reference to the drawings. FIG. 4 is a view illustrating an exemplary configuration of pre-driver 1 according to the third embodiment. In FIG. 4, the same reference numerals are applied to the constituent components having the same functions as those shown in FIG. 2.

As illustrated in FIG. 4, according to the third embodiment, the differential amplifier at the input stage is configured with a twin differential type. More specifically, the differential amplifier at the input stage includes a first differential amplifier circuit 11 and second differential amplifier circuit 12. Both the two differential amplifier circuits 11 and 12 amplify a signal inputted via the same input terminals IN1 and IN2 and output the amplified signal.

The first differential amplifier circuit 11 includes, similarly to the circuit of FIG. 2, a differential pair constituted of two transistors M1 and M2, current mirror circuits M3 and M4 for receiving an output of the differential amplifier circuit 11 in double end configuration, and a constant current circuit Ic connected to the differential pair. The gates of the pair of transistors M1 and M2 constituting the differential pair are connected to the two input terminals IN1 and IN2.

In the differential pair of the first differential amplifier circuit 11, the sources of the two transistors M1 and M2 are connected to a common source; and one end of the constant current circuit Ic is connected to this common source. The other end of the constant current circuit Ic is connected to the ground. The drains of the two transistors M1 and M2 are connected via the transistors M3 and M4, respectively, to a power supply VDD. The transistors M3 and M4 are connected to each other in current mirror form.

The second differential amplifier circuit 12 includes a differential pair constituted of two transistors M6 and M7, current mirror circuits M8 and M9 for receiving an output of the differential amplifier circuit 12 in double end configuration, and a constant current circuit Ic connected to the differential pair. The constant current circuit Ic is shared by the two differential amplifier circuits 11 and 12. The gates of the pair of transistors M6 and M7 constituting the differential pair of the second differential amplifier circuit 12 are connected to the same two input terminals IN1 and IN2 as the first differential amplifier circuit 11.

In the differential pair of the second differential amplifier circuit 12, the sources of the two transistors M6 and M7 are connected to a common source; and one end of the constant current circuit Ic is connected to this common source. The other end of the constant current circuit Ic is connected to the ground. The drains of the two transistors M6 and M7 are connected via the transistors M8 and M9, respectively, to the power supply VDD. The transistors M8 and M9 are connected to each other in current mirror form.

The output of the first differential amplifier circuit 11 is connected to the gate of a first source-grounded amplifier M5. The drain of the first source-grounded amplifier M5 is connected to the drain of a transistor M11 being one of the transistors constituting the current mirror circuit and connected to an output terminal OUT1. The source of the first source-grounded amplifier M5 is connected to the power supply VDD. In this way, according to the present embodiment, an output of the first differential amplifier circuit 11 is received by the first source-grounded amplifier M5.

Similarly, the output of the second differential amplifier circuit 12 is connected to the gate of a second source-grounded amplifier M10. The drain of the second source-grounded amplifier M10 is connected to a transistor M12 being the other of the transistors constituting the current mirror circuit. The source of the second source-grounded amplifier M10 is connected to the power supply VDD. In this way, according to the present embodiment, an output of the second differential amplifier circuit 12 is received by the second source-grounded amplifier M10.

The transistor M11 connected to the first source-grounded amplifier M5 and the transistor M12 connected to the second source-grounded amplifier M10 are connected in current mirror form. The transistor M12 is driven by the drain current of the second source-grounded amplifier M10. Here, when the two transistors M11 and M12 connected in current mirror form have the same size, the transistor M11 has the same drive capability as the transistor M12.

In the above configuration, the transistors M1, M2, M6 and M7 are all identical in polarity and size. Also, the transistors M3, M4, M8 and M9 are all identical in polarity and size. Also, the transistors M5 and M10 are identical in polarity and size. Here, the transistors M3, M4 and the transistor M5 don't need to be identical in size. Also, the transistors M8, M9 and the transistor M10 don't need to be identical in size. The transistors M11 and M12 are identical in polarity and size.

The drain current flowing in the second source-grounded amplifier M10 will be described. When there is no signal to the input terminals IN1 and IN2, the drain current (referred to as "idling current") flowing in the second source-grounded amplifier M10 is expressed as $I_{com}/4+\Delta I$ from the following reason. Here, $I_{com}$ denotes a common current value of the constant current circuit Ic; and $\Delta I$ denotes the increase in current by the channel modulation effect.

Since the operating point of the transistors M8 and M9 lies in the saturation region, when the channel modulation effect is considered, the drain current Id of the transistors M8 and M9 is expressed as (formula 3) of FIG. 8. In this (formula 3), W denotes a gate width of the transistors M8 and M9; L a gate length of the transistors M8 and M9; $\mu_0$ the mobility of carrier; $C_{OX}$ a gate oxide film capacitance per unit area; and $\lambda$ a parameter representing a relative value of variation in channel length when drain-source voltage Vds increases.

Figure 5:
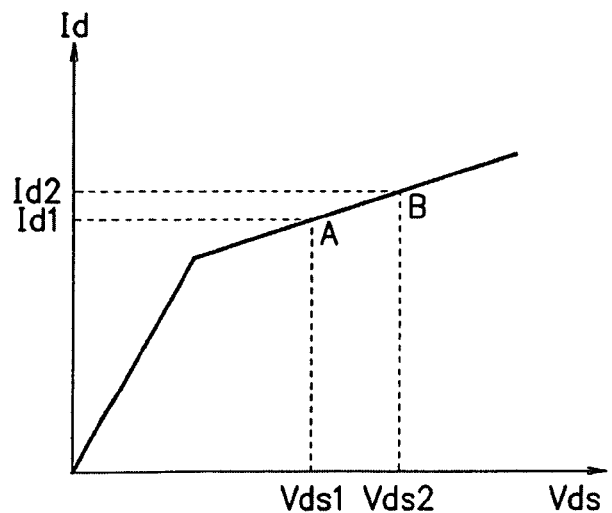
FIG. 5 is a view illustrating a relationship between drain current and drain-source voltage.

FIG. 5 is obtained by graphically representing this (formula 3). Referring to FIG. 5, it is assumed that the operating balance between the transistors M8 and M9 has been lost in the initial state; the operating point of the transistor M8 lies at point A (drain current being Id1, drain-source voltage being Vds1), and the operating point of the transistor M9 lies at point B (drain current being Id2, drain-source voltage being Vds2). However, since the drain current of the transistor M6 is equal to that of the transistor M7, the operating point of the transistor M9 inevitably moves from point B to point A by the negative feedback operation of the transistors M8 and M9. That is, the stabilization point of the transistor M9 is point A at which the drain-source voltage is Vds1.

Typically, in the saturation region of an ideal transistor having no channel modulation effect, the drain current Id does not vary according to variation in drain-source voltage Vds, so there is no stabilization point such as point A. In contrast, according to the present embodiment, there is used the channel modulation effect which originally exerts adverse effects in the circuit design, so that the stabilization point of the transistor M9 is produced. Meanwhile, since the transistor M8 is a diode having its gate and drain connected, the gate-source voltage of the transistor M9 is equal to the gate-source voltage Vgs1 of the transistor M8.

Here, the transistors M8 and M9 have the identical gate-source voltage Vgs and drain current Id, and thus the drain-source voltage of the transistor M9 is equal to the gate-source voltage Vgs1 of the transistor M8. As a result, the gate-source voltage of the second source-grounded amplifier M10 is also equal to Vgs1. However, the drain-source voltage of the second source-grounded amplifier M10 is larger than the drain-source voltage Vgs1 of the transistors M8 and M9. Thus, the idling current of the second source-grounded amplifier M10 is $I_{com}/4+\Delta I$, $\Delta I$ being the increase in current by the channel modulation effect.

When the idling current of the second source-grounded amplifier M10 when no signal is inputted is increased, the drain current of the second source-grounded amplifier M10 when a signal is inputted can also be increased. The same applies to the first source-grounded amplifier M5. The idling current of the first source-grounded amplifier M5 is also $I_{com}/4+\Delta I$ from the similar reason described above. When this idling current is increased, the drain current of the first source-grounded amplifier M5 when a signal is inputted can also be increased.

For example, in the case that the load connected to the output terminal OUT1 is heavy, and when it is desired that the drain currents of the source-grounded amplifiers M5 and M10 is increased without increasing the common current value $I_{com}$ of the constant current circuit Ic used in the differential amplifier circuits 11 and 12, it can be realized by shortening the gate length L of the source-grounded amplifiers M5 and M10 or widening the gate width W. When the semiconductor fabrication process is considered, it is easier to enlarge the gate width W.

In the pre-driver 1 according to the third embodiment having the above configuration, the dynamic range of the upper half portion (positive half period) of an alternating signal outputted from the output terminal OUT1 is determined by the drain current supply capability of the first source-grounded amplifier M5. In the first source-grounded amplifier M5, sufficiently large current supply capability can be implemented using the power supply VDD. Meanwhile, the dynamic range of the lower half portion (negative half period) of an alternating signal is determined by the drain current supply capability of the transistor M11.

As described above, the transistor M12 is connected to the transistor M11 in current mirror form; and the transistor M12 is driven by the drain current of the second source-grounded amplifier M10. Here, since the two transistors M11 and M12 connected in current mirror form have the same size, the transistor M11 has the same drive capability as the transistor M12. Accordingly, it can be said that the dynamic range of the lower half portion of an alternating signal is determined by the drain current supply capability of the second source-grounded amplifier M10. In the second source-grounded amplifier M10, also, sufficiently large current supply capability can be implemented using the power supply VDD.

As described above, according to the third embodiment, in order to produce the lower half portion of an alternating signal, the second source-grounded amplifier M10 and the current mirror circuits M11 and M12 connected thereto are used instead of the constant current circuit Io illustrated in FIG. 2. Accordingly, for the lower half portion of an alternating signal, also, a sufficiently large dynamic range can be achieved without increasing the current value of the constant current circuit.

The first to third embodiments are each of a preferred example for implementing the invention, and the technical scope of the invention should not be restrictively interpreted by the description of the embodiments. That is, many modifications to the embodiments described above are possible without departing from the spirit and gist of the invention.

INDUSTRIAL APPLICABILITY

The present invention is useful for a power amplifier of a type in which the output of a pre-driver is received by a rear-stage driver.

The invention claimed is:

1. A power amplifier comprising a pre-driver which amplifies the voltage of an input signal to a desired level; a driver which amplifies the power of an output signal of the pre-driver to a desired level; and an idling current setting circuit which sets the idling current of the driver:
the pre-driver includes a differential pair constituted of at least two transistors, and a current mirror circuit for receiving an output of the pre-driver as a single output in double end configuration;
the driver includes a push pull output transistor connected from a single output point of the pre-driver; and
the idling current setting circuit includes a current setting transistor connected to the output transistor of the driver in current mirror form, a plurality of current setting resistors, a switch for switching to any of the plurality of current setting resistors, and a resistor of a high resistance value connected to a gate of the output transistor.

2. The power amplifier according to claim 1,
the output transistor of the driver is connected via a capacitive coupling from the single output point of the pre-driver.

3. An idling current setting circuit used in a power amplifier including a pre-driver which amplifies the voltage of an input signal to a desired level and a driver which amplifies the power of an output signal of the pre-driver to a desired level, comprising:
- a current setting transistor connected to the output transistor of the driver in current mirror form;
- a plurality of current setting resistors;
- a switch for switching to any of the plurality of current setting resistors; and
- a resistor of a high resistance value connected to a gate of the output transistor.

* * * * *